(12) United States Patent
Dosho et al.

(10) Patent No.: US 7,978,013 B2
(45) Date of Patent: Jul. 12, 2011

(54) PHASE SYNCHRONIZING CIRCUIT

(75) Inventors: Shiro Dosho, Osaka (JP); Kazuaki Sogawa, Osaka (JP); Yuji Yamada, Osaka (JP); Naoshi Yanagisawa, Osaka (JP)

(73) Assignee: Panasonic Corporation, Osaka (JP)

( * ) Notice: Subject to any disclaimer, the term of this patent is extended or adjusted under 35 U.S.C. 154(b) by 309 days.

(21) Appl. No.: 12/096,664

(22) PCT Filed: Oct. 25, 2006

(86) PCT No.: PCT/JP2006/321271
§ 371 (c)(1),
(2), (4) Date: Jun. 9, 2008

(87) PCT Pub. No.: WO2007/074577
PCT Pub. Date: Jul. 5, 2007

(65) Prior Publication Data
US 2009/0278614 A1 Nov. 12, 2009

(30) Foreign Application Priority Data
Dec. 27, 2005 (JP) .................................. 2005-375323

(51) Int. Cl.
*H03L 7/00* (2006.01)

(52) U.S. Cl. ........... 331/16; 331/17; 331/34; 331/177 R; 331/1 A; 331/111; 331/143

(58) Field of Classification Search .............. 331/1 A, 331/16, 17, 34, 177 R, 111, 143
See application file for complete search history.

(56) References Cited

U.S. PATENT DOCUMENTS

| | | | |
|---|---|---|---|
| 5,389,899 A * | 2/1995 | Yahagi et al. | 331/10 |
| 5,404,250 A | 4/1995 | Hase et al. | |
| 5,727,037 A | 3/1998 | Maneatis | |
| 5,999,353 A | 12/1999 | Hase et al. | |
| 6,624,674 B1 | 9/2003 | Zhao | |
| 6,693,496 B1 | 2/2004 | Lebouleux | |
| 7,405,630 B2 * | 7/2008 | Jensen | 331/17 |

FOREIGN PATENT DOCUMENTS

| | | |
|---|---|---|
| JP | 03-163912 | 7/1991 |
| JP | 09-116430 | 5/1997 |
| JP | 11-308105 | 11/1999 |
| JP | 2000-057697 | 2/2000 |
| JP | 2000-57697 | 2/2000 |

OTHER PUBLICATIONS

Japanese Notice of Reasons for Rejection, w/ English translation thereof, issued in Japanese Patent Application No. JP 2007-551861 dated Sep. 7, 2010.

* cited by examiner

*Primary Examiner* — Arnold Kinkead
(74) *Attorney, Agent, or Firm* — McDermott Will & Emery LLP (57) ABSTRACT

A constant determination unit (90) determines various constants, that are the magnitude of a charge current outputted from a charge pump circuit (30), the time constant of a loop filter (40), and the gain of a voltage controlled oscillator (50), so as to make the proportionality constant of a natural frequency of a phase locked loop circuit for the input frequency of the phase locked loop circuit and the damping factor to be predetermined values, and outputs various control signals based on the determined constants. The charge pump circuit (30), the loop filter (40), and the voltage controlled oscillator (50) modify the magnitude of the charge current, the time constant, and the gain, respectively, in accordance with control signals outputted from the constant determination unit (90).

7 Claims, 12 Drawing Sheets

PHASE SYNCHRONIZING CIRCUIT

RELATED APPLICATIONS

This application is the U.S. National Phase under 35 U.S.C. §371 of International Application No. PCT/JP2006/321271, filed on Oct. 25, 2006, which in turn claims the benefit of Japanese Application No. 2005-375323, filed on Dec. 27, 2005, the disclosures of which Applications are incorporated by reference herein.

TECHNICAL FIELD

The present invention relates to a phase locked loop circuit, particularly to an autonomously controlled phase locked loop circuit which automatically modifies a response constant according to a frequency of an input signal.

BACKGROUND ART

Processors for signal conditioning and arithmetic operation are the core types of LSI for modern signal processing technology. In recent years, these processors were required to achieve both lower power consumption and higher operation speed. Phase locked loop circuits included in such processors, therefore, have to generate clock signals ranging from extremely high speed to extremely low speed during, for example, an intermittent operation. Since such processors are applied to a wide range of applications, input signals of an extremely wide range of frequency are given to a phase locked loop circuit. A phase locked loop circuit included in such processor, thus, desirably has a function to automatically modify a response constant depending on the frequencies of input and output signals. A phase locked loop circuit having such function is particularly called an autonomously controlled phase locked loop circuit.

Natural frequency ωon (also known as a loop bandwidth or a response frequency) and damping factor ζ of a phase locked loop circuit are generally expressed by Formulas (1) and (2) below, respectively.

Mathematical Expression 1

$$\omega n = \sqrt{\frac{KoIp}{2\pi C}} \quad (1)$$

$$\zeta = \frac{CR}{2}\omega n \quad (2)$$

wherein Ko denotes the gain of a voltage controlled oscillator, Ip denotes the magnitude of a charge current outputted from a charge pump circuit, C denotes the capacitance value of a loop filter, and R denotes the resistance value of the loop filter. Formula (3) below holds for the relationship between input frequency ωin and natural frequency ωn.

Mathematical Expression 2

$$\omega in = \alpha \omega n \quad (3)$$

wherein α is the proportionality constant.

In a phase locked loop circuit, proportionality constant α, which is a relationship between input frequency ωin and natural frequency ωn, and damping factor ζ are preferably constant regardless of input frequency ωin. A conventional autonomously controlled phase locked loop circuit controls the magnitude of a charge current and the time constant of a loop filter corresponding to the control voltage of a voltage controlled oscillator to maintain the proportionality constant and the damping factor at predetermined values with respect to a frequency variation of an input signal (for example, refer to Patent Document 1).

Patent Document 1: U.S. Pat. No. 5,727,037

DISCLOSURE OF INVENTION

Problems to be Solved by the Invention

A conventional autonomously controlled phase locked loop circuit has to vary the magnitude of a charge current at a rate of the square of a variation of the input frequency. In a case of a phase locked loop circuit having an input frequency varied in a range of hundreds-fold, particularly such as the one to be included in a processor, the charge current therefore has to be controlled in such a wide range of tens-of-thousands-fold, ranging from some tens nanoamperes to some hundreds microamperes.

An excessively small operation current in a charge pump circuit leads to an increase of the noise generated from the charge pump circuit, and the jitter characteristics of a phase locked loop circuit is deteriorated. In contrast, an excessively large operation current in a charge pump circuit leads an increase in power consumption and, since the size of transistors of the charge pump circuit has to be enlarged, the jitter characteristics of the phase locked loop circuit are deteriorated due to a charge injection noise derived from a parasitic capacitance of a transistor.

Considering such problems, an object of the present invention is to realize excellent jitter characteristics for a widely varying input frequency in a phase locked loop circuit.

Means for Solving the Problems

Means for solving the problems according to the present invention is a phase locked loop circuit including: a phase comparator for phase comparison between a reference signal and a feedback signal; a charge pump circuit for outputting a charge current based on a result of the phase comparison; a loop filter for filtering the charge current; a voltage controlled oscillator for oscillating according to an output voltage of the loop filter; an output signal frequency divider for dividing a frequency of an output signal of the voltage controlled oscillator and generating the feedback signal; and a constant determination unit for determining constants, including a magnitude of the charge current, a time constant of the loop filter, and a gain of the voltage controlled oscillator, so that a proportionality constant of a natural frequency of the phase locked loop circuit for a frequency of an input signal and a damping factor have respective predetermined values, and outputting first through third control signals based on the determined constants. The charge pump circuit is capable of modifying the magnitude of the charge current in accordance with the first control signal. The loop filter has the time constant modified in accordance with the second control signal. The voltage controlled oscillator has the gain modified in accordance with the third control signal.

According to this structure, constants including the magnitude of the charge current outputted from the charge pump circuit, the time constant of the loop filter, and the gain of the voltage controlled oscillator, are controlled according to the frequency of the input signal of the phase locked loop circuit so that the proportionality constant of the natural frequency of the phase locked loop circuit for the frequency of the input signal and the damping factor are both predetermined values. This dispenses with the requirement that the magnitude of the charge current has to be varied at a rate of the square of the variation of the input frequency, and the range of controlling the magnitude of the charge current can be relatively small. Excellent jitter characteristics are thus obtained for a wide range of variation of the input frequency.

The phase locked loop circuit preferably includes a frequency counter for measuring the frequency of the input signal, and more preferably includes a first-order oscillator for oscillating according to a bias given to the charge pump circuit. Specifically, the frequency counter counts, as the frequency of the input signal, a number of pulses of the input signal per cycle of the output signal of the first-order oscillator.

According to these structures, even in a case that the constants of the phase locked loop circuit are changed according to a change in, for example, the environmental temperature, the oscillation frequency of the first-order oscillator served as a reference for counting the input frequency also varies according to the environmental change, and thus the changes in the constants of the phase locked loop circuit are cancelled by the variation of the oscillation frequency of the first-order oscillator. Robustness against a change in the environmental temperature and the like is thus improved.

Specifically, the first-order oscillator includes: a capacitor; a first comparator for comparing magnitudes of a voltage of the capacitor and a first reference voltage, a second comparator for comparing magnitudes of the voltage of the capacitor and a second reference voltage; an RS flip flop receiving comparison results of the first and second comparators; and a charge pump circuit for charging and discharging the capacitor with a current having a magnitude corresponding to the bias in accordance with an inverting output and a noninverting output of the RS flip flop.

Specifically, the constant determination unit includes: a gain selection unit for selecting any one of a plurality of values as the gain according to the frequency of the input signal; a charge current determination unit for determining the magnitude of the charge current based on a first value, the first value being a product of a reference value of the charge current, a square value of a ratio-to-reference of the input signal frequency, and a reciprocal of a ratio-to-reference of the selected gain; and a time constant determination unit for determining the time constant based on a second value, the second value being a product of a reference value of the time constant and a reciprocal of the ratio-to-reference of the input signal frequency.

The output signal frequency divider preferably has a modifiable frequency division ratio. The charge current determination unit determines the magnitude of the charge current based on a product of the first value and a ratio-to-reference of the frequency division ratio.

The phase locked loop circuit preferably includes an input signal frequency divider for dividing a frequency of the input signal and generating the reference signal. The input signal frequency divider has a modifiable frequency division ratio. The charge current determination unit determines the magnitude of the charge current based on a product of the first value and a square value of a reciprocal of a ratio-to-reference of the frequency division ratio. The time constant determination unit determines the time constant based on a product of the second value and the ratio-to-reference of the frequency division ratio.

The loop filter preferably has a resistance value modified in accordance with the third control signal and has a capacitance value modified in accordance with a fourth control signal. The constant determination unit includes a capacitance value selection unit for selecting any one of a plurality of values as the capacitance value of the loop filter according to the frequency of the input signal, determines the capacitance value of the loop filter, and outputs the fourth control signal based on the determined constants. The charge current determination unit determines the magnitude of the charge current based on a product of the first value and a ratio-to-reference of the selected capacitance value. The time constant determination unit determines the resistance value of the loop filter based on a product of the second value and a reciprocal of the ratio-to-reference of the selected capacitance value.

The constant determination unit preferably includes a proportionality constant selection unit for selecting any one of a plurality of values as the proportionality constant according to the frequency of the input signal. The charge current determination unit determines the magnitude of the charge current based on a product of the first value and a reciprocal of a square value of a ratio-to-reference of the selected proportionality constant. The time constant determination unit determines the time constant based on a product of the second value and the ratio-to-reference of the selected proportionality constant.

The loop filter preferably includes a switched capacitor filter. Specifically, the switched capacitor filter is controlled by the input signal.

Effects of the Invention

As described above, according to the present invention, the magnitude of a charge current can be controlled in the first-order of the variation of the input frequency of the phase locked loop circuit, and deterioration in the jitter characteristics derived from the magnitude control of the charge current is inhibited to realize excellent jitter characteristics.

DESCRIPTION OF REFERENCE NUMERALS

10 Frequency Divider (Input Signal Frequency Divider)
20 Phase Comparator
30 Charge Pump Circuit
40, 40A, 40B Loop Filter
401 Switched Capacitor Filter
50 Voltage Controlled Oscillator
60 Frequency Divider (Output Signal Frequency Divider)
70 First-order Oscillator
701 Capacitor 702 Comparator (First Comparator)
703 Comparator (Second Comparator)
704 RS Flip Flop
705 Charge Pump Circuit
80 Frequency Counter
90, 90A Constant Determination Unit
91 Gain Selection Unit
93, 93A Charge Current Determination Unit
94, 94A Time Constant Determination Unit
95 Capacitance Value Selection Unit
92 Proportionality Constant Selection Unit

BEST MODE FOR CARRYING OUT THE INVENTION

Hereinafter, best mode for carrying out the present invention is described with reference to the drawings.

First Embodiment

Figure 1:
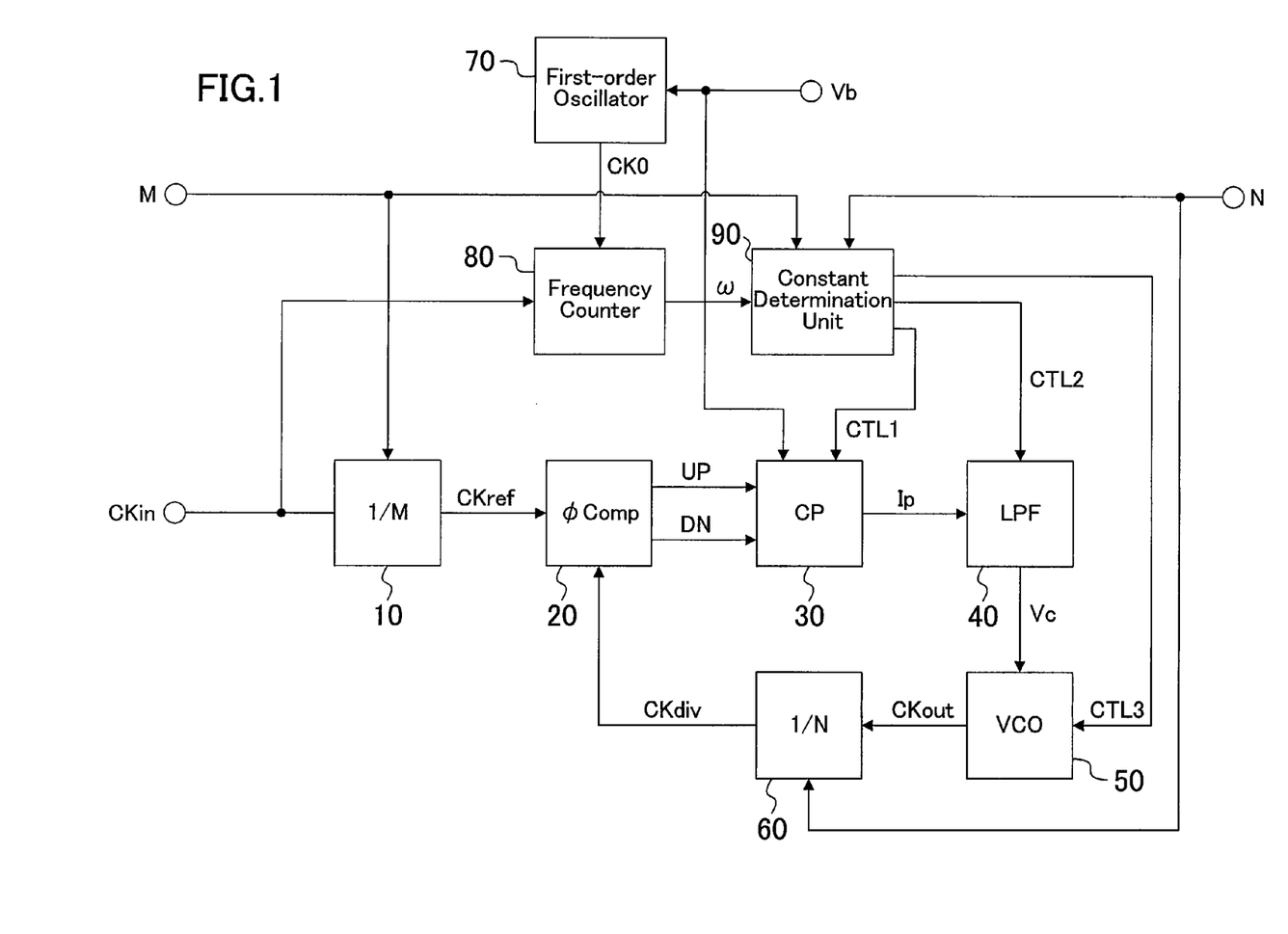
FIG. 1 is a block diagram of a phase locked loop circuit according to the first embodiment.

FIG. 1 shows a structure of a phase locked loop circuit according to the first embodiment. The phase locked loop circuit includes a frequency divider 10 for generating reference signal CKref by dividing the frequency of input signal CKin, a phase comparator 20 for comparing the phases of reference signal CKref and feedback signal CKdiv, a charge pump circuit 30 for outputting charge current Ip (hereinbelow, Ip may be referred to as the magnitude of a charge current) based on the phase comparison result (signals UP and DN), a loop filter 40 for filtering charge current Ip, a voltage controlled oscillator 50 for oscillating in accordance with output voltage Vc of the loop filter 40, a frequency divider 60 for generating feedback signal CKdiv by dividing the frequency of output signal CKout of the voltage controlled oscillator 50, a first-order oscillator 70 for oscillating according to bias Vb given to the charge pump circuit, a frequency counter 80 for counting the number of pulses of input signal CKin per cycle of output signal CK0 of the first-order oscillator 70, and a constant determination unit 90 for determining various constants of the phase locked loop circuit.

The frequency divider 10 is arranged so as to be capable of modifying the frequency division ratio (1/M) in accordance with frequency division ratio setting value M which is inputted to the frequency divider 10. Similarly, the frequency divider 60 is arranged so as to be capable of modifying the frequency division ratio (1/N) in accordance with frequency division ratio setting value N which is inputted to the frequency divider 60. The charge pump circuit 30 is arranged such that the magnitude of charge current Ip is modified in accordance with control signal CTL1. The loop filter 40 is arranged such that the time constant is modified in accordance with control signal CTL2. The voltage controlled oscillator 50 is arranged such that the gain is modified in accordance with control signal CTL3. These control signals CTL1, CTL2, and CTL3 are outputted from the constant determination unit 90 based on count value ω outputted from the frequency counter 80 and the frequency division ratio setting values M and N.

Figure 2:
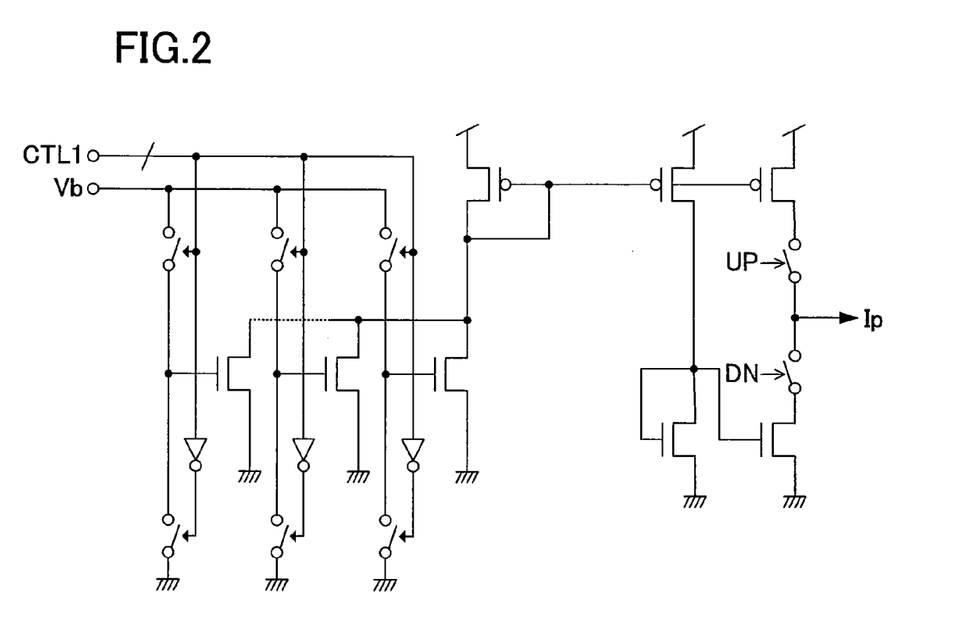
FIG. 2 is an internal view of a charge pump circuit.

FIG. 2 shows an example of the internal structure of the charge pump circuit 30. The charge pump circuit 30 according to the example is arranged so as to change the number of NMOS transistors connected to input terminals of bias Vb in accordance with control signal CTL1. The magnitude of charge current Ip is varied according to the number of NMOS transistors connected to the input terminals of bias Vb.

Figure 3:
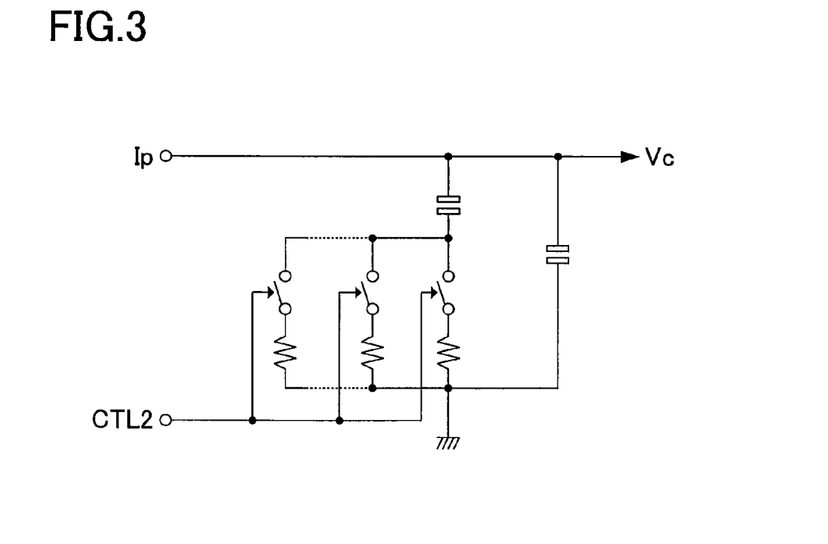
FIG. 3 is an internal view of a loop filter.

FIG. 3 shows an example of the internal structure of the loop filter 40. The loop filter 40 according to the example is arranged so as to change the number of parallel connected resistors in accordance with control signal CTL2. The time constant of the loop filter 40 is changed according to the number of parallel connected resistors.

Figure 4:
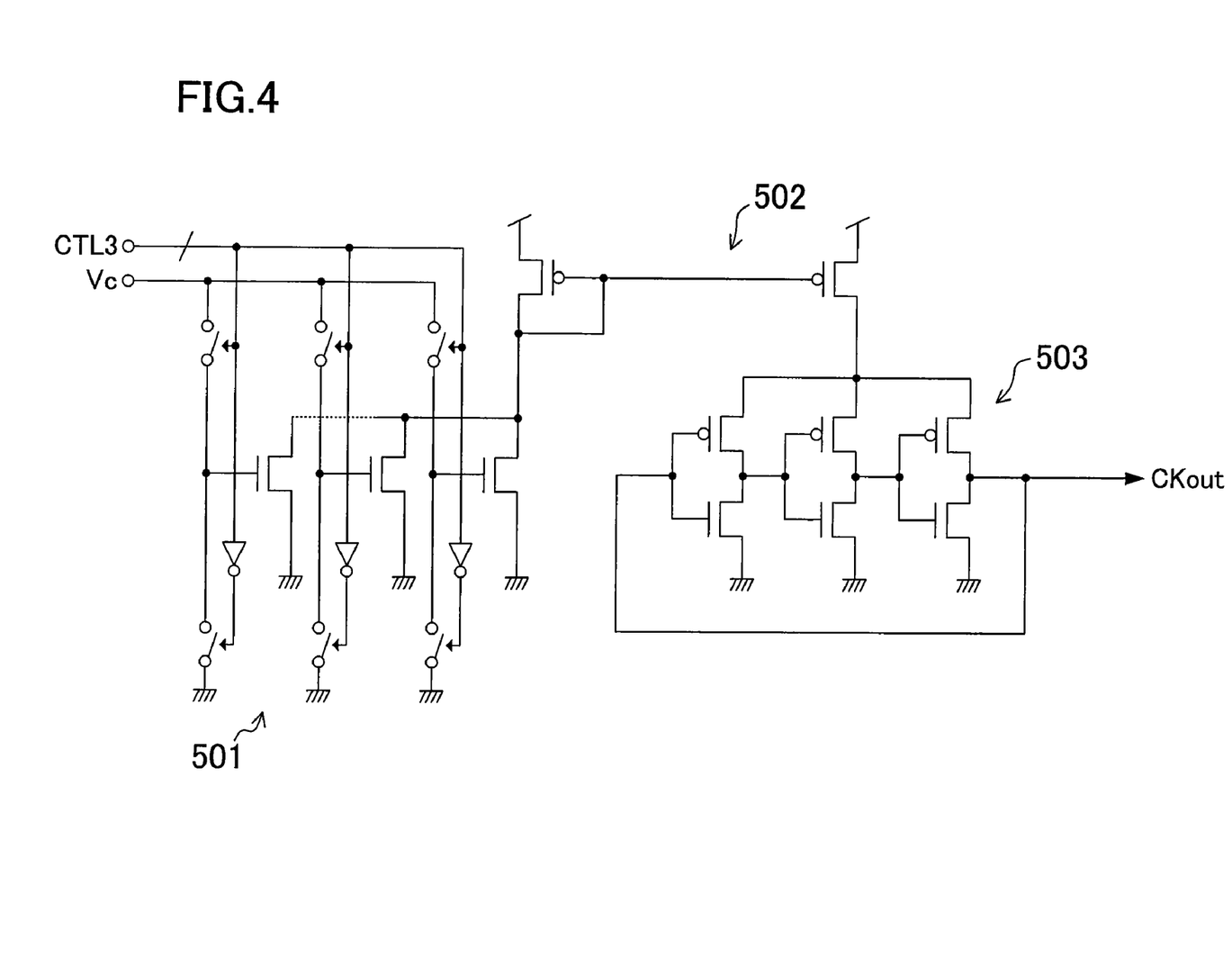
FIG. 4 is an internal view of a voltage controlled oscillator.

FIG. 4 shows an example of the internal structure of the voltage controlled oscillator 50. The voltage controlled oscillator 50 according to the example includes a voltage/current converter 501, a current mirror circuit 502, and an inverter chain oscillator 503. Control voltage Vc is converted to a current by the voltage/current converter 501, and then the current mirrored by the current mirror circuit 502 drives the inverter chain oscillator 503. The voltage/current converter 501 is arranged so as to change the number of NMOS transistors connected to input terminals of control voltage Vc in accordance with control signal CTL3. The gain of the voltage controlled oscillator 50 is varied according to the number of NMOS transistors connected to input terminals of control voltage Vc.

Figure 5:
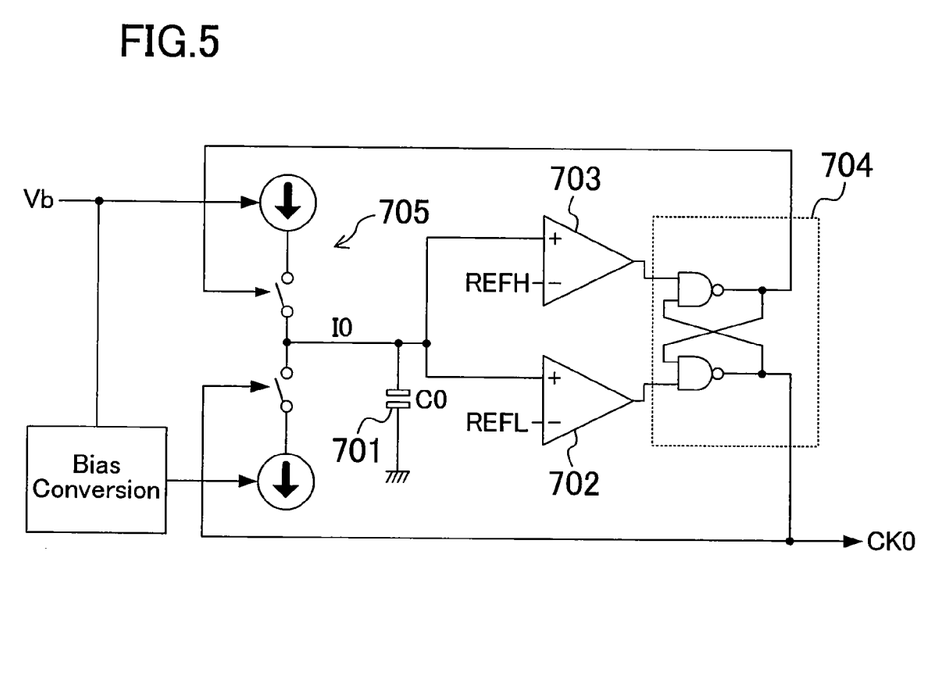
FIG. 5 is an internal view of a first-order oscillator.
Figure 6:
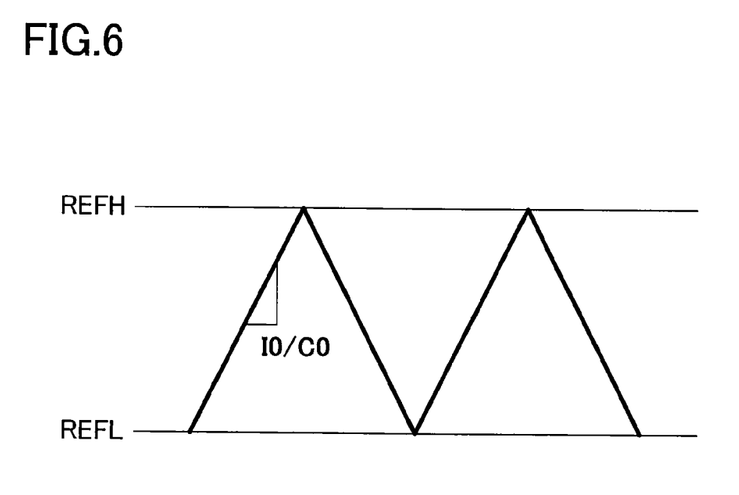
FIG. 6 is a diagram showing the oscillation waveform of the first-order oscillator.

FIG. 5 shows an example of the internal structure of the first-order oscillator 70. The first-order oscillator 70 according to the example includes a capacitor 701, a comparator 702 for comparing the magnitudes of the voltage of the capacitor 701 and reference voltage REFH, a comparator 703 for comparing the magnitudes of the voltage of the capacitor 701 and reference voltage REFL (where REFH>REFL), an RS flip flop 704 receiving comparison results of the comparators 702 and 703, and a charge pump circuit 705 for charging and discharging the capacitor 701 with a current of the magnitude corresponding to bias Vb in accordance with the inverting and noninverting outputs of the RS flip flop 704. Either one of the inverting and noninverting outputs of the RS flip flop 704 is to be output signal CK0 of the first-order oscillator 70. FIG. 6 shows the oscillation waveform of the first-order oscillator 70. The oscillation waveform of the first-order oscillator 70 is triangular, varying between reference voltages REFH and REFL. Oscillation frequency ω0 of the first-order oscillator 70 is expressed as Formula (4) below, wherein C0 denotes the capacitance value of the capacitor 701 and I0 denotes the magnitude of the output current of the charge pump circuit 705.

Mathematical Expression 3

$$\omega 0 = \frac{I0}{2 \cdot C0 \cdot (REFH - REFL)} \quad (4)$$

Figure 7:
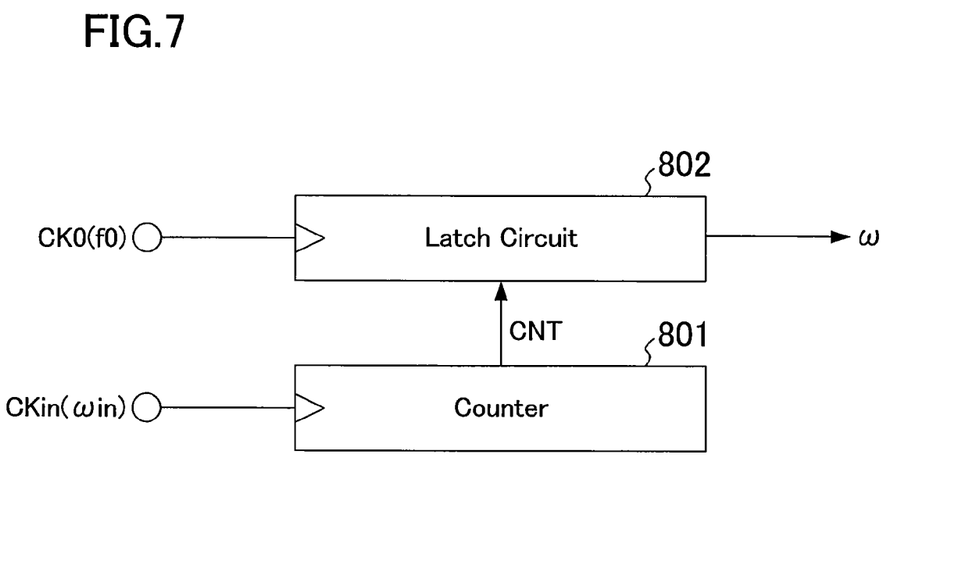
FIG. 7 is an internal view of a frequency counter.

FIG. 7 shows an example of the internal structure of the frequency counter 80. The frequency counter 80 according to the example includes a counter 801 for counting the number of pulses in input signal CKin (frequency coin) and a latch circuit 802 for latching count value CNT of the counter 801 with output signal CK0 of the first-order oscillator 70. That is, the frequency counter 80 counts the number of pulses of input signal CKin per cycle of output signal CK0 (frequency ω0) of the first-order oscillator 70 to output count value ω. Count value ω is thus expressed as Formula (5) below.

Mathematical Expression 4

$$\omega = \frac{\omega in}{\omega 0} \quad (5)$$

In the phase locked loop circuit, considering the frequency division ratios of the frequency dividers 10 and 60, Formulas (1) and (2) are converted to Formulas (6) and (7) below.

Mathematical Expression 5

$$\frac{\frac{\omega in}{M}}{\alpha} = \sqrt{\frac{\frac{Ko}{N} Ip}{2\pi C}} \tag{6}$$

$$\zeta = \frac{CR}{2} \frac{\frac{\omega in}{M}}{\alpha} \tag{7}$$

By using ωref as the reference value for input frequency ωin, Kref as the reference value for gain Ko, 1/Mref and 1/Nref as the reference values for frequency division ratios 1/M and 1/N, αref as the reference value for proportionality constant α, Iref as the reference value for charge current Ip, and Rref as the reference value for resistance value R of the loop filter 40, charge current Ip and resistance value R can be expressed as Formulas (8) and (9) below.

Mathematical Expression 6

$$Ip = Iref \times \frac{\left(\frac{\omega}{\omega ref}\right)^2}{\left(\frac{M}{Mref}\right)^2} \cdot \frac{1}{\left(\frac{\alpha(\omega)}{\alpha ref}\right)^2} \cdot \frac{\frac{N}{Nref}}{\frac{Ko(\omega)}{Kref}} \tag{8}$$

$$R = Rref \times \frac{\alpha(\omega)}{\alpha ref} \cdot \frac{\frac{M}{Mref}}{\frac{\omega}{\omega ref}} \tag{9}$$

It should be noted that ωwin in Formulas (6) and (7) is substituted by count value ω outputted from the frequency counter 80 in Formulas (8) and (9). α(ω) is a function returning proportionality constant α using count value ω as a variable, and Ko(ω) is a function returning gain Ko using count value ω as a variable.

Figure 8:
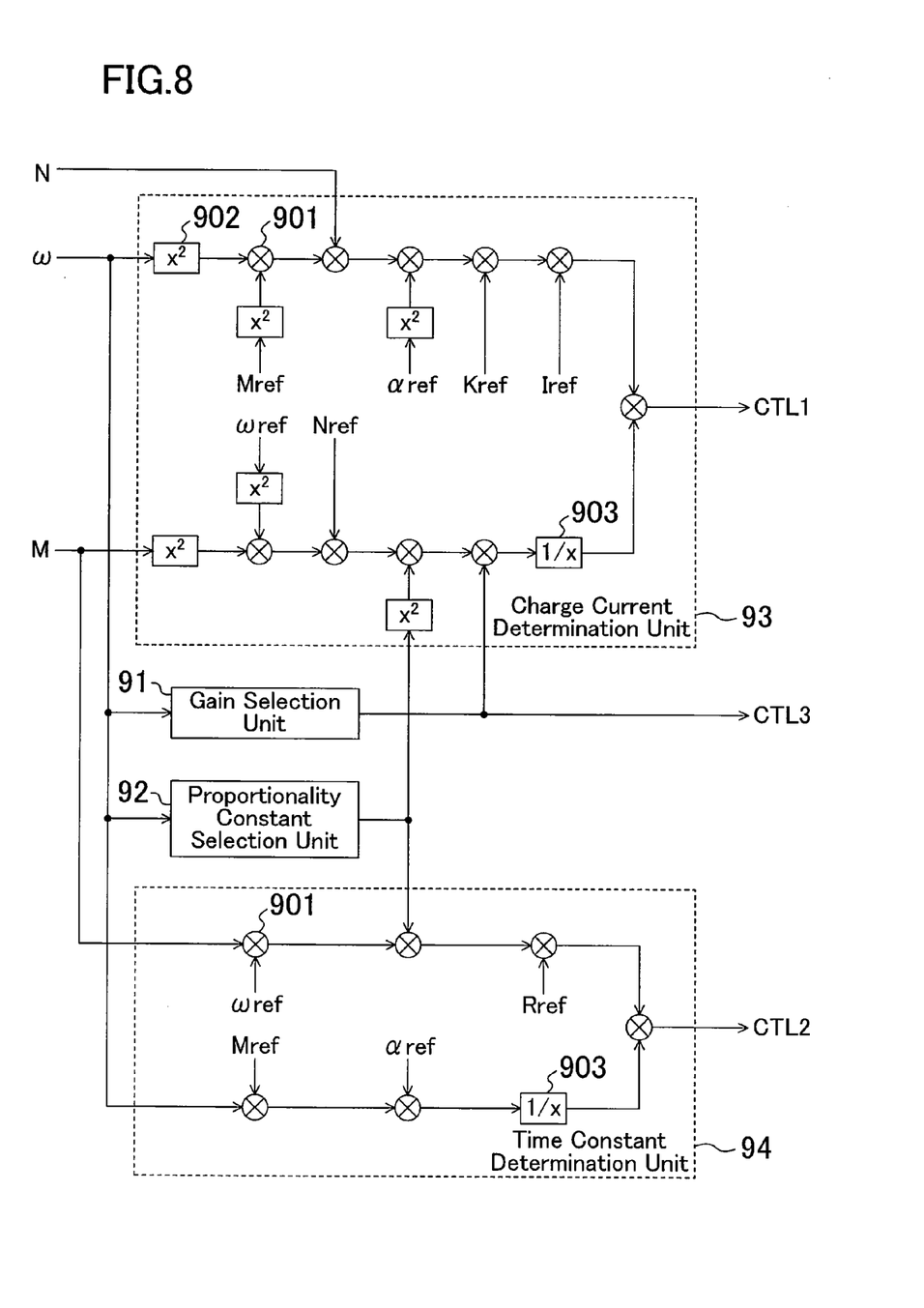
FIG. 8 is an internal view of a constant determination unit.

The constant determination unit 90 outputs, in accordance with Formulas (8) and (9), control signal CTL1 for controlling the magnitude of charge current Ip, control signal CTL2 for controlling the time constant of the loop filter 40, and control signal CTL3 for controlling the gain of the voltage controlled oscillator 50. FIG. 8 shows an example of the internal structure of the constant determination unit 90. The constant determination unit 90 according to the example includes a gain selection unit 91, a proportionality constant selection unit 92, a charge current determination unit 93, and a time constant determination unit 94.

The gain selection unit 91 outputs control signal CTL2 indicating gain Ko which corresponds to count value ω. That is, the gain selection unit 91 realizes the function Ko(ω) above. Similarly, the proportionality constant selection unit 92 outputs a signal indicating proportionality constant α which corresponds to count value c. That is, the proportionality constant selection unit 92 realizes the function α(ω). Specifically, the gain selection unit 91 and the proportionality constant selection unit 92 are realized by a respective lookup table outputting a discrete value for count value ω.

The charge current determination unit 93 includes a plurality of multipliers 901, a plurality of square multiplier circuits 902, and a reciprocal operator 903. The charge current determination unit 93 receives count value ω, the frequency division ratio setting values M and N, the output of the gain selection unit 91, and the output of the proportionality constant selection unit 92 to output control signal CTL1 for controlling the magnitude of charge current Ip for count value ω in accordance with Formula (8). The time constant determination unit 94 includes a plurality of multipliers 901 and a reciprocal operator 903. The time constant determination unit 94 receives count value ω, the frequency division ratio setting values M and N, and the output of the proportionality constant selection unit 92 to output control signal CTL2 for controlling the time constant of the loop filter 40 for count value ω in accordance with Formula (9). The various reference values, such as ωref internally inputted by the charge current determination unit 93 and the time constant determination unit 94, are stored in registers.

It should be noted that the structure of the constant determination unit 90 described above is merely an example, and various other circuit structures may be applied to realize Formulas (8) and (9). The magnitude of charge current Ip, the time constant of the loop filter 40, and the gain of the voltage controlled oscillator 50 also may be calculated by mathematical operation using, for example, a processor.

Figure 9:
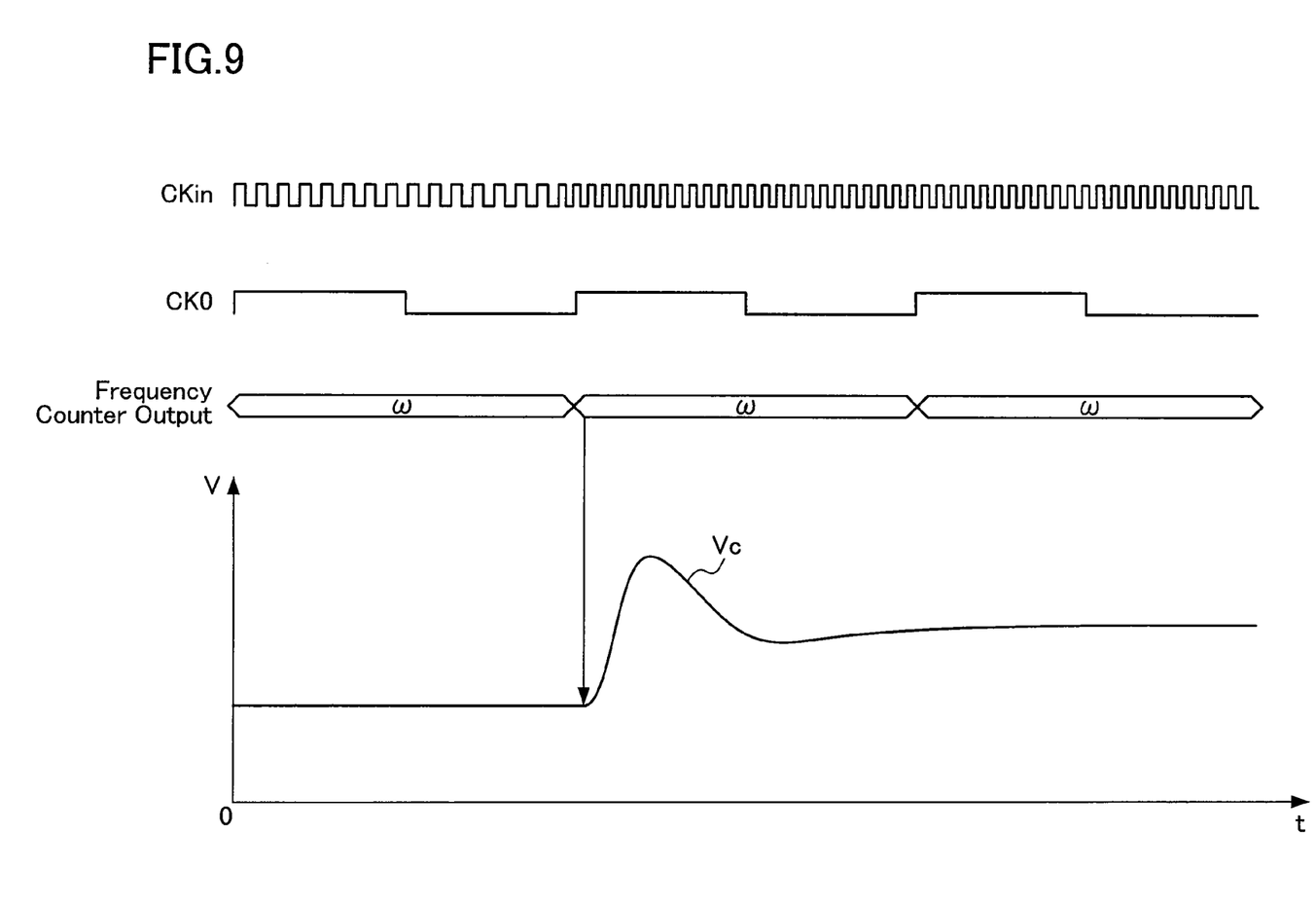
FIG. 9 is a graph showing response characteristics of the phase locked loop circuit according to the first embodiment.

FIG. 9 is a graph showing response characteristics of the phase locked loop circuit. As frequency ωin of input signal CKin varies, count value ω changes and the constants of the phase locked loop circuit are modified according to the change of count value ω. As a result, control voltage Vc of the voltage controlled oscillator 50 varies in synchronization with the phase of input signal CKin and converges to a predetermined value.

In a general phase locked loop circuit, a change in the environmental temperature and the like causes a variation in factors, such as the magnitude of charge current Ip and various capacitance values, to change the response characteristics. In contrast, the present phase locked loop circuit automatically controls the constants based on count value ω of the frequency counter 80 which varies depending on oscillation frequency ω0 of the first-order oscillator 70, and thus it has excellent robustness as described below. For example, when charge current Ip is increasing (or decreasing) due to a change in the environmental temperature and the like, current I0 in the first-order oscillator 70 is also increasing (or decreasing). When current I0 increases (or decreases), oscillation frequency ω0 of the first-order oscillator 70 increases (or decreases), and count value ω of the frequency counter 80 decreases (or increases). As a result, the magnitude of charge current Ip is controlled so as to decrease (or increase) by the constant determination unit 90 to cancel the variation in charge current Ip.

In a case that the first-order oscillator 70 and the loop filter 40 are implemented on an identical chip, capacitance value C0 of the capacitor 701 in the first-order oscillator 70 and capacitance value C of the loop filter 40 change at the same rate. When, for example, capacitance value C of the loop filter 40 decreases (or increases), capacitance value C0 of the capacitor 701 in the first-order oscillator 70 decreases (or increases) accordingly at the same rate. A decrease (or an increase) in capacitance value C0 of the capacitor 701 causes oscillation frequency ω0 of the first-order oscillator 70 to increase (or decrease), and count value ω of the frequency counter 80 decreases (or increases). As a result, the magnitude of charge current Ip is controlled to decrease (or increase) by the constant determination unit 90, and in Formula (6), the change in capacitance value C of the loop filter 40 is cancelled by controlling charge current Ip.

Since a same bias is given to the charge pump circuit 30 and the first-order oscillator 70, the variation in charge current Ip due to the bias variation is cancelled. Such bias variation due to a change in, for example, the environmental temperature may be inhibited by supplying bias Vb from a reference voltage source, however.

As described above, according to the first embodiment, a variation in the input frequency controls both the magnitude of the charge current and the gain of the voltage controlled oscillator at the same time, and the range of variation in the magnitude of the charge current can be relatively small. In an example that the input frequency varies within a range of 100-fold, by setting the gain of the voltage controlled oscillator to be variable within a range of 16-fold, the range of variation in the charge current can be as small as 625-fold ($=100^2/16$). That is, the rate of the variation in the magnitude of the charge current is of the first order of the variation in the input frequency. This allows avoiding the use of the very small charge current and dispenses with the requirement to particularly increase the size of transistors of the charge pump circuit, and deterioration is thus avoided in the jitter characteristics of the phase locked loop circuit.

The frequency division ratios of the frequency dividers 10 and 60 and proportionality constant α also may be fixed values. The frequency divider 10 also may be omitted. For the case of not considering the robustness, a crystal oscillator or the like also may be employed instead of the first-order oscillator 70. In the case that information related to the frequency of the input signal is externally given to the phase locked loop circuit, the frequency counter 80 also may be omitted particularly.

Figure 10:
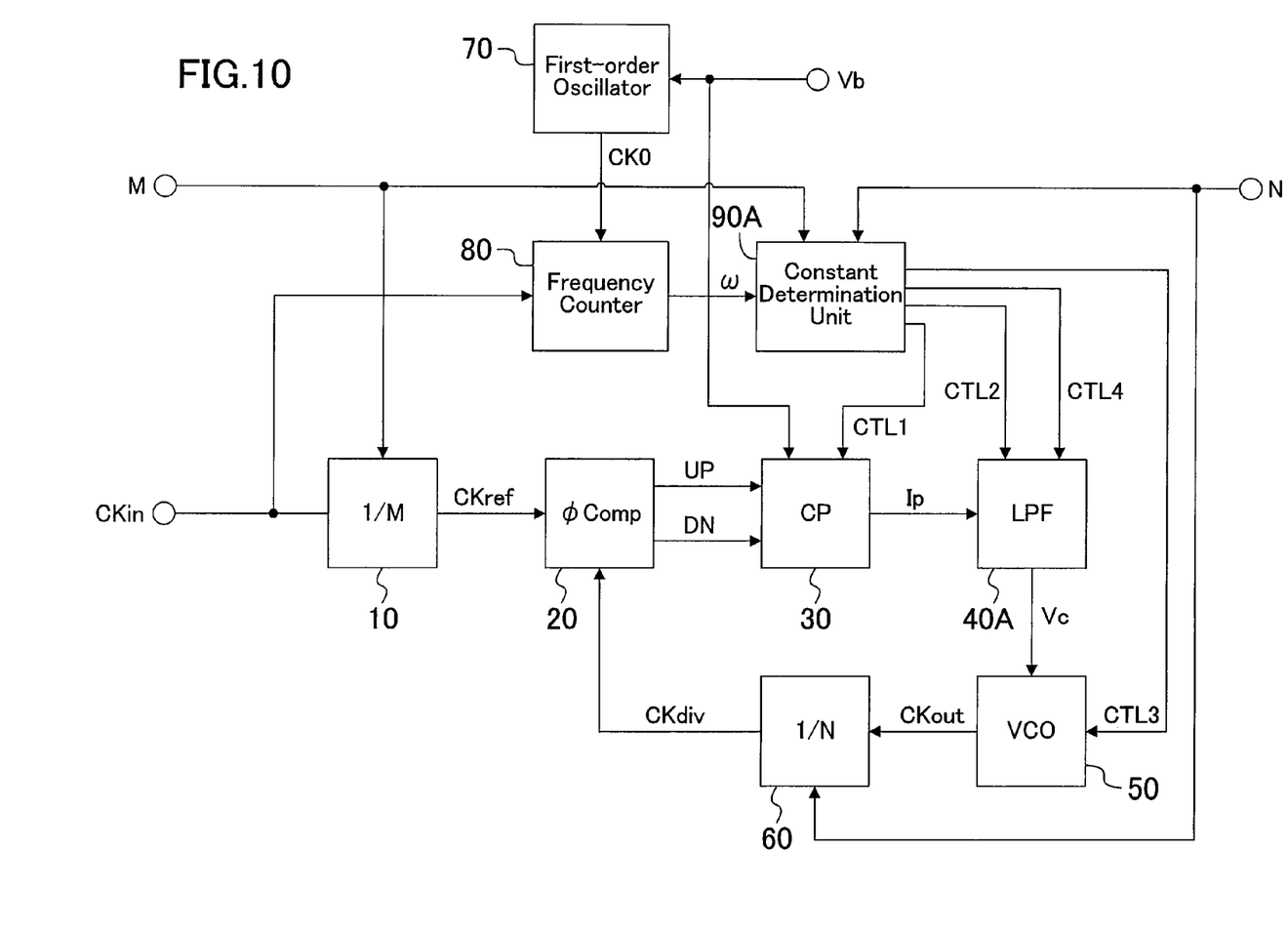
FIG. 10 is a block diagram of a phase locked loop circuit according to the second embodiment.

It is also possible to input reference signal CKref instead of input signal CKin to the frequency counter 80. It, however, causes deterioration in accuracy of In Formula (6), the range of variation in the charge current can be even smaller by making capacitance value C variable, too. FIG. 10 shows the structure of a phase locked loop circuit according to the second embodiment. The phase locked loop circuit is arranged to make capacitance value C variable. Specifically, the phase locked loop circuit includes a loop filter 40A and a constant determination unit 90A, both arranged differently from those in the phase locked loop circuit according to the first embodiment. The loop filter 40A is arranged such that the time constant is modified in accordance with control signals CTL2 and CTL4. Control signal CTL4 is outputted from the constant determination unit 90A. The description below describes only the aspects different from the first embodiment.

Figure 11:
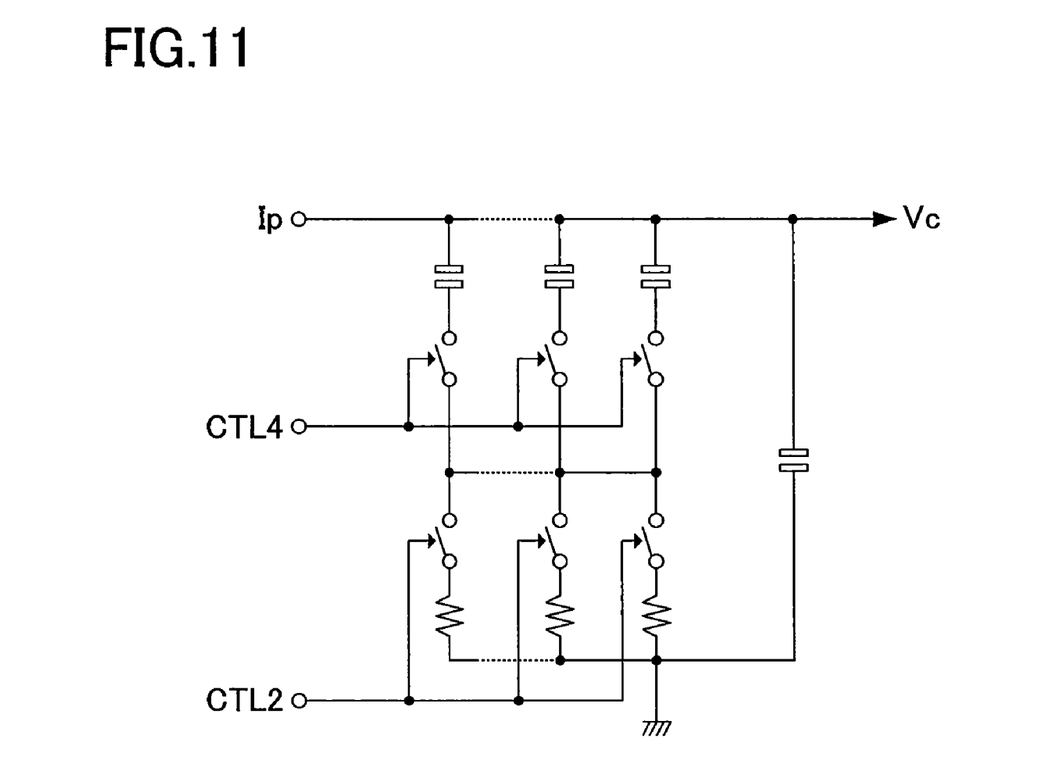
FIG. 11 is an internal view of a loop filter.

FIG. 11 shows an example of the internal structure of the loop filter 40A. The loop filter 40A according to the example is arranged so as to change the number of parallel connected resistors in accordance with control signal CTL2 and change the number of parallel connected capacitors in accordance with control signal CTL4. The time constant of the loop filter 40A changes according to the numbers of parallel connected resistors and capacitors.

In a case that capacitance value C in Formula (6) is variable, Formulas (8) and (9) are expressed as Formulas (10) and (11) below.

Mathematical Expression 7

$$Ip = Iref \times \frac{\left(\frac{\omega}{\omega ref}\right)^2}{\left(\frac{M}{Mref}\right)^2} \cdot \frac{\frac{C(\omega)}{Cref}}{\left(\frac{\alpha(\omega)}{\alpha ref}\right)^2} \cdot \frac{\frac{N}{Nref}}{\frac{Ko(\omega)}{Kref}} \qquad (10)$$

$$R = Rref \times \frac{\alpha(\omega)}{\alpha ref} \cdot \frac{\frac{M}{Mref}}{\frac{\omega}{\omega ref}} \cdot \frac{1}{\frac{C(\omega)}{Cref}} \qquad (11)$$

wherein Cref denotes the reference value of capacitance value C, C(ω) denotes a function returning capacitance value C using count value ω as a variable.

$$R = Rref \times \frac{\alpha(\omega)}{\alpha ref} \cdot \frac{\frac{M}{Mref}}{\frac{\omega}{\omega ref}} \cdot \frac{1}{\frac{C(\omega)}{Cref}} \qquad (11)$$

wherein Cref denotes the reference value of capacitance value C, C(ω) denotes a function returning capacitance value C using count value ω as a variable.

Figure 12:
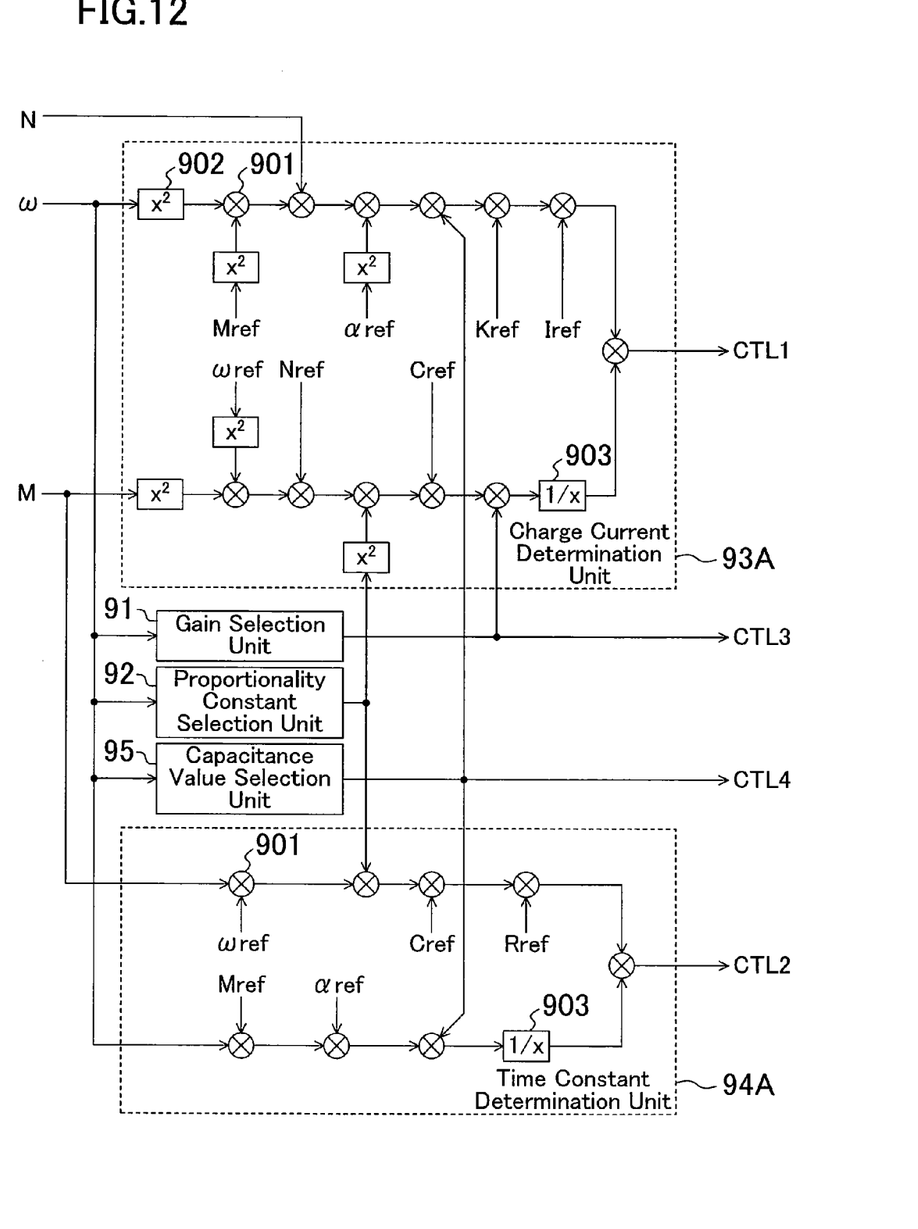
FIG. 12 is an internal view of a constant determination unit.

FIG. 12 shows an example of the internal structure of the constant determination unit 90A. The constant determination unit 90A according to the example includes a capacitance value selection unit 95 in addition to the constant determination unit 90 shown in FIG. 8. The capacitance value selection unit 95 outputs control signal CTL4 indicating capacitance value C corresponding to count value ω. That is, the capacitance value selection unit 95 realizes the function C(ω) above. Specifically, the capacitance value selection unit 95 is realized by a lookup table outputting a discrete value for a count value ω.

A charge current determination unit 93A outputs control signal CTL1 for controlling the magnitude of charge current Ip for count value c in accordance with Formula (10). A time constant determination unit 94A outputs control signal CTL2 for controlling the resistance value of the loop filter 40 for count value ω in accordance with Formula (II). Reference value Cref internally inputted in the charge current determination unit 93A and the time constant determination unit 94A is stored in registers.

It should be noted that the structure of the constant determination unit 90A is merely an example, and various other circuit structures may be applied to realize Formulas (10) and (11). The magnitude of charge current Ip, the resistance and capacitance values of the loop filter 40A, and the gain of the voltage controlled oscillator 50 also may be calculated by mathematical operation using, for example, a processor.

As described above, according to the second embodiment, a variation in the input frequency controls both the gain of the voltage controlled oscillator and the capacitance value at the same time, and the range of variation in the magnitude of the charge current can be even smaller than the case of the first embodiment. In an example that the input frequency varies within a range of 100-fold, by making both the gain of the voltage controlled oscillator and the capacitance value to be variable within a range of 16-fold, the range of variation in the charge current can be as less as approximately 39-fold ($=100^2/16/16$).

Third Embodiment

Figure 13:
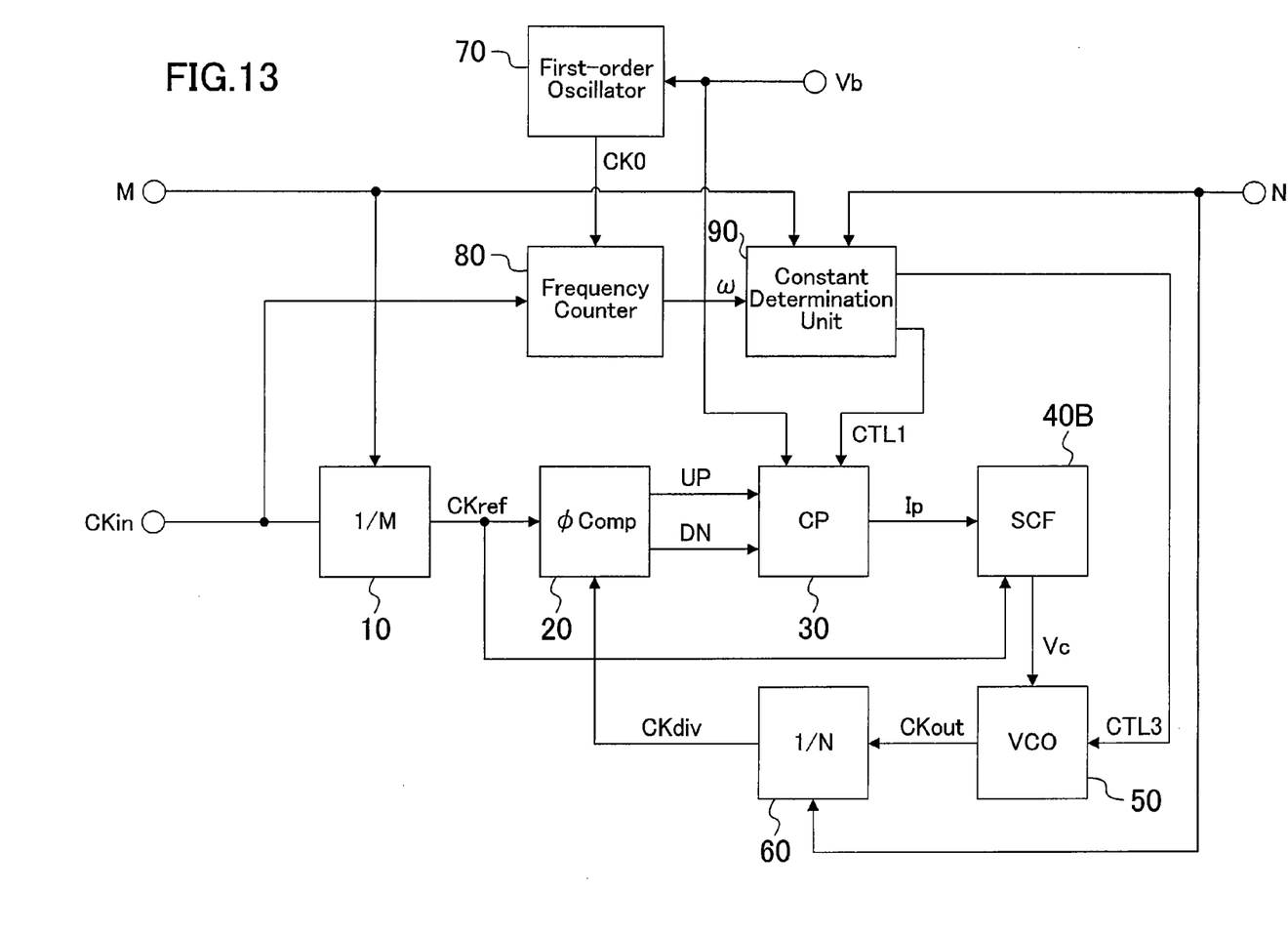
FIG. 13 is a block diagram of a phase locked loop circuit according to the third embodiment.

FIG. 13 shows a structure of a phase locked loop circuit according to the third embodiment. The phase locked loop circuit includes a loop filter 40B including a switched capacitor filter instead of the loop filter 40 in the phase locked loop circuit according to the first embodiment. The description below describes only the aspects different from the first embodiment.

Figure 14:
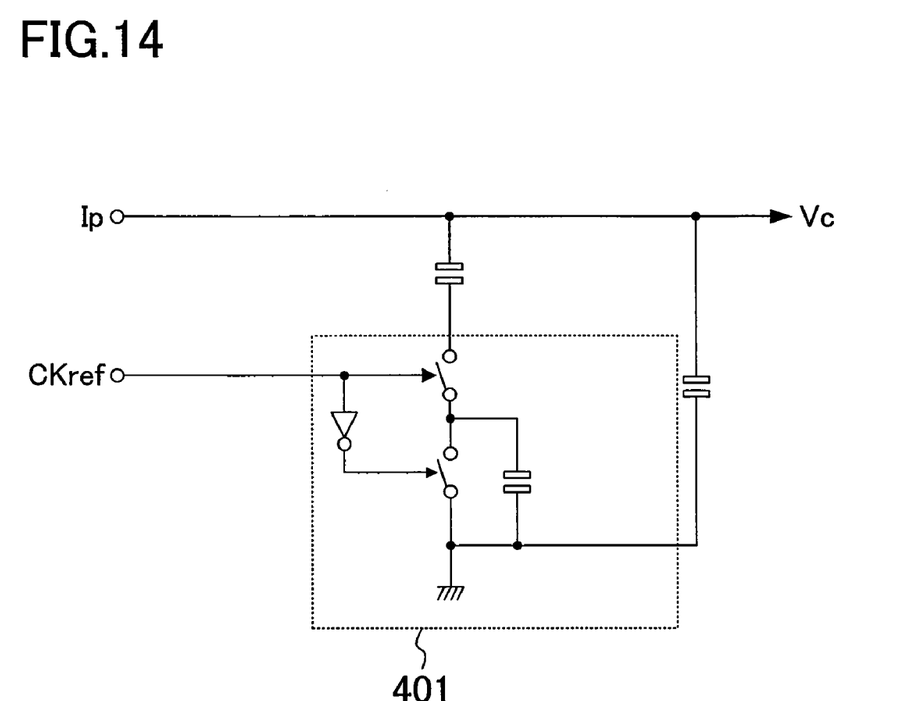
FIG. 14 is an internal view of a loop filter.

FIG. 14 shows an example of the internal structure of the loop filter 40B. The loop filter 40B according to the example includes a switched capacitor filter 401 which is controlled by reference signal CKref. The cutoff frequency of the switched capacitor filter 401 is proportional to ωin/M, which is the frequency of reference signal CKref, and the variation of input frequency ωin and the change in resistance value R are cancelled in Formula (7) to secure damping factor ζ constant. This dispenses with the requirement that the constant determination unit 90 generates the signal to control the time constant of the loop filter 40B, and the circuit is simplified.

It should be noted that the switched capacitor filter 401 also may be controlled by input signal CKin instead of reference signal CKref. Although the switched capacitor filter 401 also may be controlled by output signal CKout of the voltage controlled oscillator 50, it is preferably controlled by input signal CKin or reference signal CKref because output signal CKout is not outputted when, for example, the phase locked loop circuit is activated and the switched capacitor filter 401 does not function.

INDUSTRIAL APPLICABILITY

The phase locked loop circuit according to the present invention is included particularly in processors for, for example, signal conditioning and arithmetic operation because of the excellent jitter characteristics for the widely varying input frequency, and is useful as a phase locked loop circuit for generating a synchronizing signal in such processors.

The invention claimed is:

1. A phase locked loop circuit comprising:
a phase comparator for phase comparison between a reference signal and a feedback signal;
a charge pump circuit for outputting a charge current based on a result of the phase comparison;
a loop filter for filtering the charge current;
a voltage controlled oscillator for oscillating according to an output voltage of the loop filter; and
an output signal frequency divider for dividing a frequency of an output signal of the voltage controlled oscillator and generating the feedback signal, wherein the charge pump circuit modifies a magnitude of the charge current in accordance with a first control signal,
the loop filter has a time constant modified in accordance with a second control signal, the voltage controlled oscillator has a gain modified in accordance with a third control signal, and
said phase locked loop circuit further comprising a frequency counter for measuring a frequency of an input signal, and a constant determination unit for determining constants, including the magnitude of the charge current, the time constant of the loop filter, and the gain of the voltage controlled oscillator, so that a proportionality constant of a natural frequency of the phase locked loop circuit for the frequency of the input signal and a damping factor have respective predetermined values, and outputting the first through third control signals based on the determined constants,
said phase locked loop circuit further comprising a first-order oscillator for oscillating according to a bias given to the charge pump circuit,
wherein the frequency counter counts, as the frequency of the input signal, a number of pulses of the input signal per cycle of the output signal of the first-order oscillator.

2. The phase locked loop circuit according to claim 1, wherein the first-order oscillator includes:
a capacitor;
a first comparator for comparing magnitudes of a voltage of the capacitor and a first reference voltage,
a second comparator for comparing magnitudes of the voltage of the capacitor and a second reference voltage;
an RS flip flop receiving comparison results of the first and second comparators; and
a charge pump circuit for charging and discharging the capacitor with a current having a magnitude corresponding to the bias in accordance with an inverting output and a noninverting output of the RS flip flop.

3. A phase locked loop circuit comprising:
a phase comparator for phase comparison between a reference signal and a feedback signal;
a charge pump circuit for outputting a charge current based on a result of the phase comparison;
a loop filter for filtering the charge current;
a voltage controlled oscillator for oscillating according to an output voltage of the loop filter; and
an output signal frequency divider for dividing a frequency of an output signal of the voltage controlled oscillator and generating the feedback signal, wherein the charge pump circuit modifies a magnitude of the charge current in accordance with a first control signal,
the loop filter has a time constant modified in accordance with a second control signal, the voltage controlled oscillator has a gain modified in accordance with a third control signal, and
the phase locked loop circuit further comprises a constant determination unit for determining constants, including the magnitude of the charge current, the time constant of the loop filter, and the gain of the voltage controlled oscillator, so that a proportionality constant of a natural frequency of the phase locked loop circuit for a frequency of an input signal and a damping factor have respective predetermined values, and outputting the first through third control signals based on the determined constants,
wherein the constant determination unit includes:
a gain selection unit for selecting any one of a plurality of values as the gain according to the frequency of the input signal;
a charge current determination unit for determining the magnitude of the charge current based on a first value, the first value being a product of a reference value of the charge current, a square of a ratio-to-reference of the input signal frequency, and a reciprocal of a ratio-to-reference of the selected gain; and
a time constant determination unit for determining the time constant based on a second value, the second value being a product of a reference value of the time constant and a reciprocal of the ratio-to-reference of the input signal frequency.

4. The phase locked loop circuit according to claim 3, wherein
the output signal frequency divider has a modifiable frequency division ratio, and
the charge current determination unit determines the magnitude of the charge current based on a product of the first value and a ratio-to-reference of the frequency division ratio.

5. The phase locked loop circuit according to claim 3, further comprising an input signal frequency divider for dividing a frequency of the input signal and generating the reference signal, wherein
   the input signal frequency divider has a modifiable frequency division ratio,
   the charge current determination unit determines the magnitude of the charge current based on a product of the first value and a square value of a reciprocal of a ratio-to-reference of the frequency division ratio, and
   the time constant determination unit determines the time constant based on a product of the second value and the ratio-to-reference of the frequency division ratio.

6. The phase locked loop circuit according to claim 3, wherein
   the loop filter has a resistance value modified in accordance with the third control signal and has a capacitance value modified in accordance with a fourth control signal,
   the constant determination unit includes a capacitance value selection unit for selecting any one of a plurality of values as the capacitance value of the loop filter according to the frequency of the input signal, determines the capacitance value of the loop filter, and outputs the fourth control signal based on the determined constants,
   the charge current determination unit determines the magnitude of the charge current based on a product of the first value and a ratio-to-reference of the selected capacitance value, and
   the time constant determination unit determines the resistance value of the loop filter based on a product of the second value and a reciprocal of the ratio-to-reference of the selected capacitance value.

7. The phase locked loop circuit according to claim 3, wherein
   the constant determination unit includes a proportionality constant selection unit for selecting any one of a plurality of values as the proportionality constant according to the frequency of the input signal,
   the charge current determination unit determines the magnitude of the charge current based on a product of the first value and a reciprocal of a square value of a ratio-to-reference of
   the selected proportionality constant, and the time constant determination unit determines the time constant based on a product of the second value and the ratio-to-reference of the selected proportionality constant.

* * * * *